United States Patent
Lyles et al.

(10) Patent No.: US 8,378,868 B2
(45) Date of Patent: Feb. 19, 2013

(54) SYSTEMS AND METHODS FOR ANALOG TO DIGITAL CONVERTER CHARGE STORAGE DEVICE MEASUREMENT

(75) Inventors: Umar Jameer Lyles, Palm Bay, FL (US); Bertan Bakkaloglu, Scottsdale, AZ (US); Brian P. Lum-Shue-Chan, Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 12/939,486

(22) Filed: Nov. 4, 2010

(65) Prior Publication Data

US 2012/0112941 A1    May 10, 2012

(51) Int. Cl.
*H03M 3/00* (2006.01)
*H02J 7/00* (2006.01)
(52) U.S. Cl. .................. 341/143; 320/134; 320/136
(58) Field of Classification Search .................. 341/143; 320/134, 136
See application file for complete search history.

(56) References Cited

U.S. PATENT DOCUMENTS

| | | | | |
|---|---|---|---|---|
| 7,081,737 B2 * | 7/2006 | Liu et al. | | 320/130 |
| 8,004,246 B2 * | 8/2011 | Liu et al. | | 320/136 |
| 8,143,857 B2 * | 3/2012 | Li | | 320/132 |
| 2005/0110464 A1 * | 5/2005 | Baker | | 320/134 |
| 2010/0327806 A1 * | 12/2010 | Brisebois | | 320/116 |

OTHER PUBLICATIONS

U.S. Appl. No. 12/836,865, filed Jul. 15, 2010.

* cited by examiner

*Primary Examiner* — Khai M Nguyen
(74) *Attorney, Agent, or Firm* — William B. Kempler; Wade J. Brady, III; Frederick J. Telecky, Jr.

(57) ABSTRACT

Systems and methods for analog to digital conversion charge storage device measurement are presented. In multi-cell charge storage device monitoring systems, accurate measurement of cell voltages is used for protection of the multi-cell device. The disclosed cell referenced solution converts the cell voltage to a digital representation referenced at the cell voltage. The digital representation referenced to the cell voltage is then level shifted to a ground referenced signal suitable for digital post processing. This processing may be used for fault detection of over-voltage, under-voltage, open cell, and similar fault conditions and cell capacity measurements. An example embodiment implements a sigma delta modulator to perform the signal transformation from analog to digital. The disclosed systems and methods may be differential and stackable for multiple cells.

17 Claims, 3 Drawing Sheets

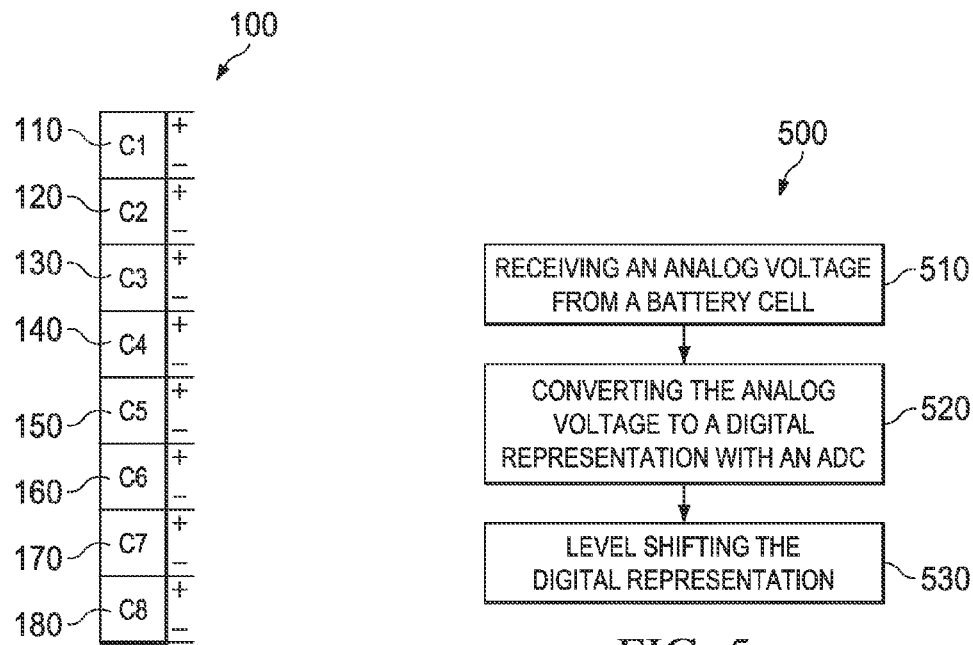
FIG. 1
FIG. 5
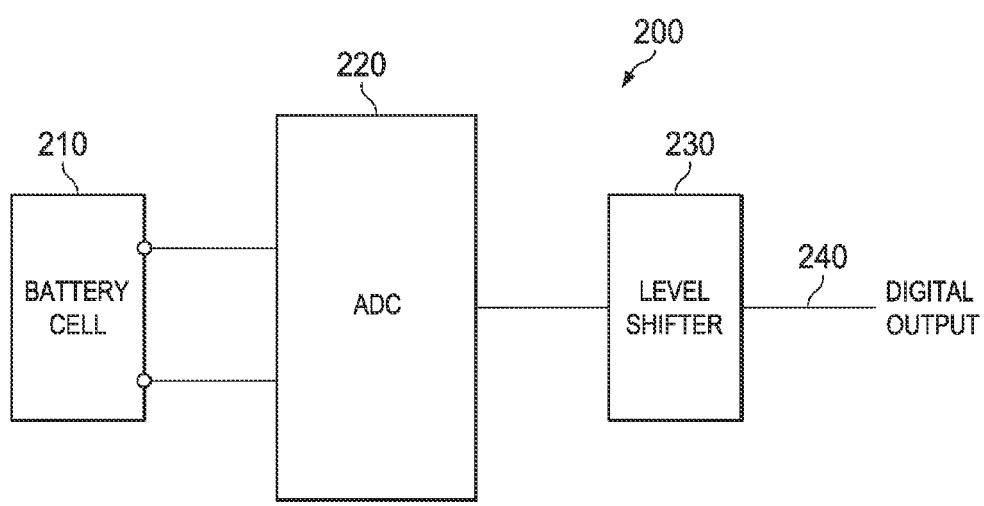
FIG. 2

SYSTEMS AND METHODS FOR ANALOG TO DIGITAL CONVERTER CHARGE STORAGE DEVICE MEASUREMENT

TECHNICAL FIELD

The present disclosure is generally related to electronics and, more particularly, is related to charge storage device measurement.

BACKGROUND

Charge storage monitoring systems for monitoring a plurality of battery cells, as an example, may often identify and compute individual cell and battery bank operating parameters. Other charge storage may include fuel cells, battery cells of any chemistry, and super capacitors, among others. It may be advantageous to determine a battery cell anomaly, a condition in which one or more cells has characteristics that are outside of acceptable ranges of properly operating cells, such as over voltage (OV), under voltage (UV), and over current (OC). These systems often comprise a controller, a multiplexer, an analog board, a voltage sensor circuit, and a control board. The controller is configured for designating a given battery cell to be monitored. The multiplexer is responsive to designation by the controller for selecting a given battery cell to be monitored or for selecting a battery pack to be monitored. The analog board is for receiving electrical signals from a given battery cell for providing an output representing measurement of a parameter (voltage, temperature, and the like) of the given battery cell. The voltage sensor circuit is for sensing voltage appearing across positive and negative terminals of the battery pack. The control board is responsive to address information for selectively initiating a load test, battery bank charging, or common-mode voltage measurement, for example. Monitoring systems have also been devised to detect over voltage (OV) conditions in battery packs. These cell status detection systems may often include a reference and a comparator to sense the cell condition.

SUMMARY

Example embodiments of the present disclosure provide systems of analog to digital converter charge storage device measurement. Briefly described, in architecture, one example embodiment of the system, among others, can be implemented as follows: a sigma-delta ($\Sigma\Delta$) modulator with a first positive reference and a first negative reference, the $\Sigma\Delta$ modulator configured to interface with a charge storage device, the $\Sigma\Delta$ modulator further configured to output a digital representation of a voltage potential of the charge storage device, the first positive reference electrically connected to a first terminal of the charge storage device and the first negative reference electrically connected to a second terminal of the charge storage device.

Embodiments of the present disclosure can also be viewed as providing methods for analog to digital charge storage device measurement. In this regard, one embodiment of such a method, among others, can be broadly summarized by the following steps: receiving an analog input voltage from a charge storage device; and converting the analog input voltage to a digital representation with a sigma delta (LA) modulator, the LA modulator referenced to positive and negative outputs of the charge storage device.

BRIEF DESCRIPTION OF THE DRAWINGS

FIG. 1 is a circuit diagram of an example embodiment of a charge storage cell pack.

FIG. 2 is a block diagram of an example embodiment of a system of sigma delta charge storage device measurement.

FIG. 5 is a flow diagram of an example embodiment of a method of sigma delta charge storage device measurement.

DETAILED DESCRIPTION

Figure 3:
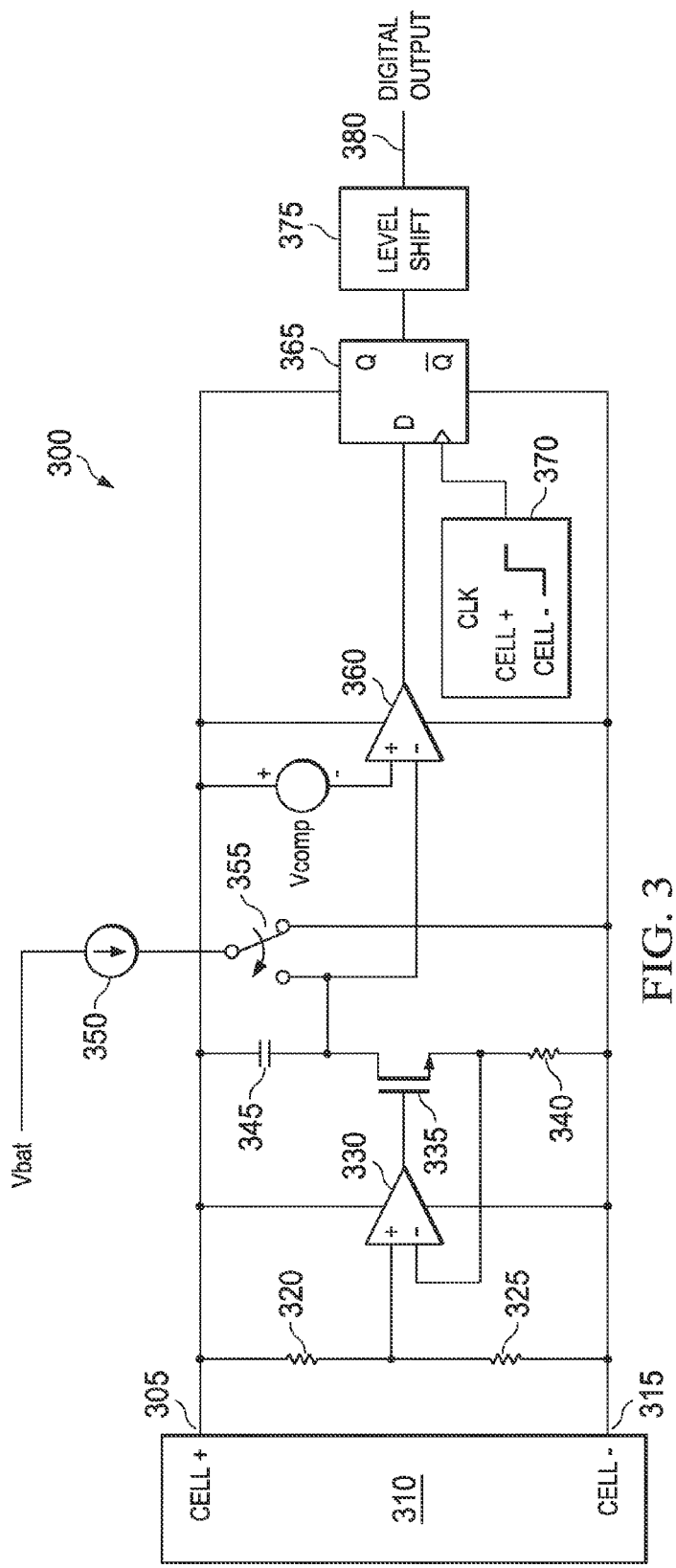
FIG. 3 is a circuit diagram of an example embodiment of the system of sigma delta charge storage device measurement of FIG. 2.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Systems and methods for analog to digital conversion charge storage device measurement are presented. In multi-cell charge storage device monitoring systems, accurate measurement of cell voltages is used for protection of the multi-cell device. The disclosed cell referenced solution converts the cell voltage to a digital representation referenced at the cell voltage. The digital representation referenced to the cell voltage is then level shifted to a ground referenced signal suitable for digital post processing. This processing may be used for fault detection of over-voltage, under-voltage, open cell, and similar fault conditions and cell capacity measurements. An example embodiment implements a sigma delta modulator to perform the signal transformation from analog to digital. The disclosed systems and methods may be differential and stackable for multiple cells.

The disclosed systems and methods are different from previous solutions in that the previous solutions perform a transformation from an analog high voltage cell referenced signal to a low voltage ground referenced signal prior to the measurement of the cell voltage, whereas the disclosed systems and methods perform the transformation from the analog to digital signal at the cell voltage level and then translate the digital signal from the high voltage level to a low voltage level ground referenced signal without introducing analog level shifting error into the cell property measurements. Cell measurement is performed at the cell and the translation is performed in the digital domain, which significantly reduces translation error. The ADC runs off of a single cell such that low voltage devices can be utilized, which may significantly reduce the semiconductor area. The current used to perform cell measurements compared to a similar ground-referenced measurement system may be reduced by a factor of 1/(number of cells). Design challenges associated with analog translation of high voltage cells may be significantly reduced with the disclosed systems and methods.

FIG. 1 provides an example embodiment of multi-cell pack 100. Multi-cell pack 100 includes cell1 110, cell2 120, cell3, 130, cell4, 140, cell5 150, cell6 160, cell7 170, and cell8 180. This example embodiment uses an 8 cell pack, but pack 100 could have 10 cells, 4 cells, 2 cells, or any other multiple cell arrangement. Safety conditions on the cell may be monitored and various conditions may be observed to determine if an individual cell in pack 100 is in over voltage, under voltage, shorted, etc. Previous solutions include sampling of the voltage on the cell and translating that sample down to a ground referenced circuit. In an example embodiment of a 10-cell pack in which the top cell may potentially be between 40 and 50 volts, that cell voltage may be sampled on a capacitor or the voltage may be converted and sent down to a ground reference circuit to detect the cell condition.

In example embodiments of this disclosure, the voltage is determined at the cell level and converted to a digital representation which is easier to translate to a ground referenced signal. Each cell 110, 120, ..., 180 is monitored individually. In example embodiments, there is one converter per cell. Each cell may be in a particular state, independent of the others, so each individual cell in multi-cell pack 100 has a dedicated converter. In an alternative embodiment some cells or all cells may share converters. In an example embodiment, the converter circuits are differential with supply voltages based on each individual cell. The conversion may be performed at the cell voltage and then passed to a ground referenced circuit. In a particular example in which a cell has a negative terminal voltage at 45V from ground and a positive terminal voltage at 50V from ground, the cell voltage is translated down to a signal from 0 to 5 volts, as referenced to ground. Detection may then be based off of the 0 to 5 volt signal.

If the cell voltage is first translated to a ground referenced signal in the analog domain, errors may be introduced due to discontinuity, among other factors. However, if the cell voltage is converted to a digital signal at the cell voltage level, the translation to a ground reference signal only involves translating a one or a zero. Therefore, there is no distortion to be concerned about. Another advantage regards the silicon area used in device fabrication. In the past, when the translation of the analog cell voltage is translated down to ground level before any conversion is performed, high voltage components are used because, for example, a 45 to 50 volt signal is being translated down to a 0 to 5 volt signal. However, using example embodiments of the present disclosure, instead of using high voltage components to translate an analog signal from the top of the cell down to a ground referenced signal, the analog signal is converted to a digital representation at the cell level.

Since, for example, the differential cell voltage is 5 volts, a 5 volt analog to digital converter can be used. Then only one high voltage device is needed to translate the high voltage digital signal down to, for example, a 5V ground referenced signal. This digital signal is much easier to translate down than is the analog signal, and errors inherent in the translation of the analog voltage do not pertain to the translation of the digital representation. One advantage to this implementation is a decrease in device area. The low voltage implementation may achieve a size decrease by, for example, a factor of two. As this is implemented in multiple cell packs, the savings in silicon area becomes significant.

FIG. 2 provides a block diagram of system 200 for charge storage device measurement. System 200 includes battery cell 210, analog to digital converter (ADC) 220, level shifter 230, and digital output 240. In an example embodiment, ADC 220 may be any converter topology including, but not limited to sigma delta (ΣΔ), flash, successive approximation, sample and hold, pipeline, ramp-compare, and integrating converters, among others. The input to ADC 220 may be connected to the cell 210, and the supply voltage of ADC 220 may be referenced to the positive and negative terminals of cell 210. The output of ADC 220 is at the voltage level of cell 210. In a ten-cell battery pack, this may be at 50V from ground. But ADC 220, in an example embodiment, is referenced to the positive and negative terminals of a single cell and may use low voltage transistors. The digital output of ADC 220 may then be shifted to a ground referenced digital signal with level shifter 230 to produce digital output 240.

FIG. 3 provides circuit 300 of an example ΣΔ implementation of the ADC. Example circuit 300 measures the voltage of cell 310, connected at positive terminal 305 and negative terminal 315. Resistor divider of resistor 320 and resistor 325 sample the voltage of cell 310 and present it to amplifier 330. Integrating capacitor 345 integrates the current through nMOS device 335. The current through nMOS device 335 is determined by amplifier 330, resistor 320, resistor 325, and resistor 340. The integrated current is then combined with current form current reference 350. In an example embodiment, current reference 350 is generated from the battery voltage, or the top most cell in the battery pack. The integrated current is then compared to a reference voltage by comparator 360. Reference voltage Vcomp doesn't have to be accurate; it may be sufficiently arbitrary such that it is tied to the voltage of cell 310.

The output of comparator 360 is electrically connected to flip flop 365. D flip flop 365 is clocked through clock circuit 370. Clock circuit 370 produces a clock signal that is referenced to positive terminal 305 and negative terminal 315. An example circuit for clock circuit 370 is provided in U.S. patent application Ser. No. 12/836,865, filed on Jul. 15, 2010, which is incorporated by reference herein in its entirety. In this example embodiment, the output of D flip flop 365 is the digital representation of the voltage between positive terminal 305 and negative terminal 315, referenced between positive terminal 305 and negative terminal 315. The output of D flip flop 365 may be switching between 45 and 50 volts as referenced to ground. To process this signal with a processor, such as a microprocessor, digital signal processor, general processor, etc., the high voltage output of flip flop 365 is shifted down to ground referenced digital output signal 380 with level shifter 375. In an example embodiment, level shifter 375 is a high voltage transistor and digital output signal 380 switches between 0 and 5 V.

In a ΣΔ example embodiment, digital output signal 380 of the ΣΔ modulator outputs a single bit per clock cycle. The bit stream comprises a density of ones and zeros. The stream can be 100% ones or 0% ones and anything in between that. The bit density of digital output signal 380 is a reflection of the voltage between positive terminal 305 and negative terminal 315. So if the cell voltage is 5V, the output of the modulator is all ones. At 2.5 volts, the output is fifty percent ones, such as 101010. At zero volts on the cell, the output is all zeros. There is a bit output for every clock cycle and the density is relative to the cell voltage. Processing may be performed based on the intended application. Processing may include examples such as, but not limited to over-voltage, under-voltage, over-current, and cell capacity, among others.

Figure 4:
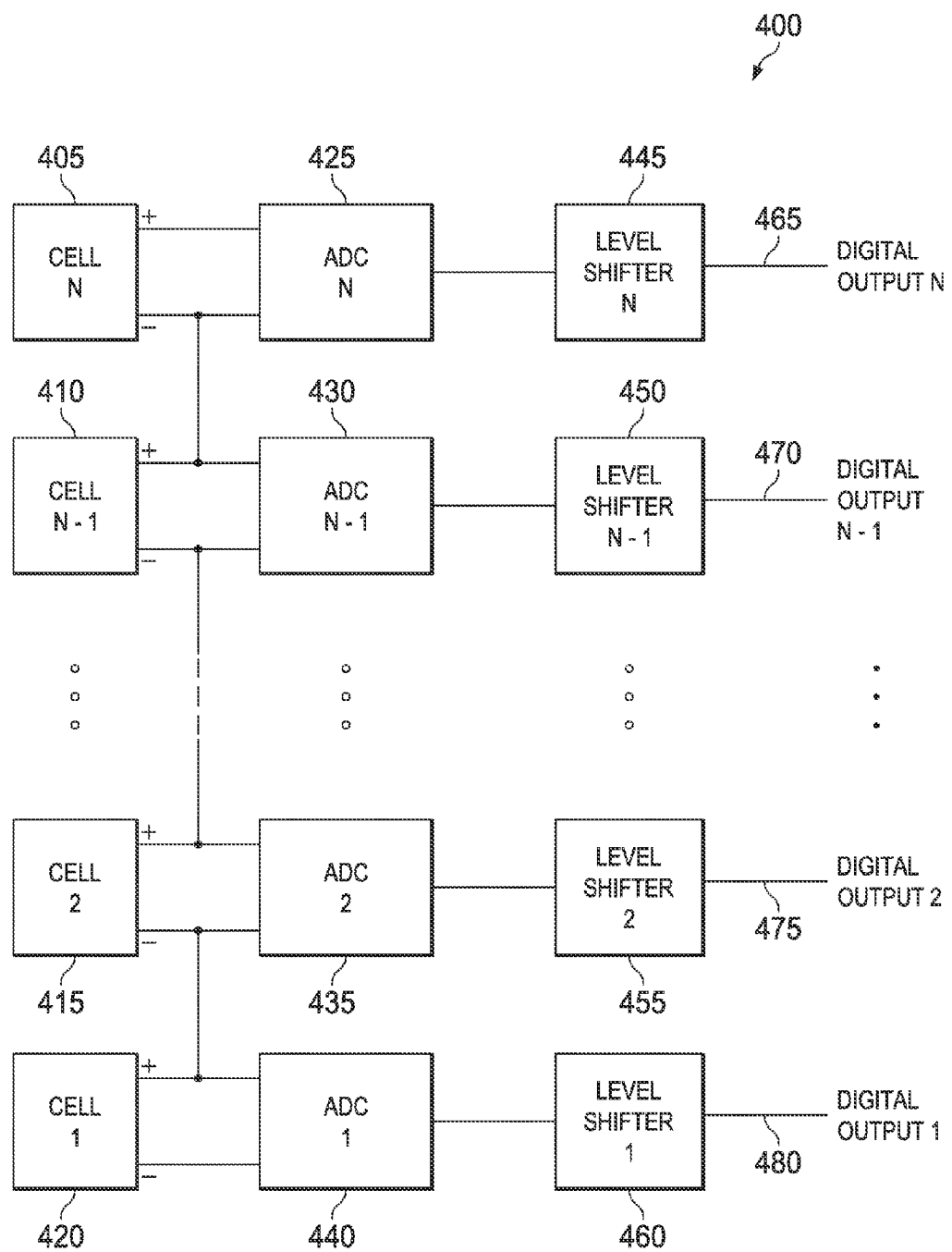
FIG. 4 is a block diagram of an example embodiment of a multiple cell system using the system of sigma delta charge storage device measurement of FIG. 2.

FIG. 4 provides block diagram 400 of a multiple cell battery pack. The multiple cell pack includes cell1 420, cell2 415, ... cellN-1 410, and cellN 405. An ADC is used for each cell. In this implementation, the array of ADCs includes ADC1 440, ADC 2 435, ..., ADCN-1 430, and ADCN 425. Each ADC in turn may have a level shifter for shifting from the battery referenced voltage level to a ground referenced voltage level. So each ADC has level shifter1 460 with digital output1 480, level shifter2 455 with digital output2 475, level shifterN-1 450 with digital output-1 470, and level shifterN 445 with digital output 465. In an example embodiment, each cell has a dedicated ADC and level shifter. Each ADC is electrically connected in series such that the resistor dividers form a string from the top cell, cellN 405, to the bottom cell, cell 1 420. So, the current through the resistor divider for each cell doesn't go to ground, it gets re-used for the resistor divider below it. In previous solutions, ten ground referenced circuits would use, for example, 20 microamps each. Then the supply current would be 20 microamps multiplied by the ten cells. However, in the disclosed systems and methods of analog to digital converter charge storage device measurement, the current is re-used all the way down the stack so that the supply current is reduced by one over the number of cells.

In example embodiments, the ADCs may be packaged as one ADC per semiconductor device. Alternatively, multiple ADCs may be packaged in one semiconductor device. This could be done with one ΣΔ, modulator per chip or you could have multiple ΣΔ modulators per chip.

FIG. 5 provides flow diagram 500 for an example embodiment of a method of ADC charge storage device measurement. In block 510, an ADC receives an analog voltage from a battery cell. The cell may be any voltage as referenced from ground, for example, with a negative terminal voltage of 45V from ground and a positive terminal voltage of 50V from ground. In block 520, the analog voltage sampled from the battery cell is converted to a digital representation, still referenced to the cell terminals, with an analog to digital converter. The ADC may be, for example, but not limited to one or more of the following topologies: sigma delta (ΣΔ), flash, successive approximation, sample and hold, pipeline, ramp-compare, and integrating converters, among others. In block 530, the digital representation is level shifted to a ground referenced signal.

Although the present invention has been described in detail, it should be understood that various changes, substitutions and alterations can be made thereto without departing from the spirit and scope of the invention as defined by the appended claims.

Therefore, at least the following is claimed:

1. A system comprising:
    a sigma-delta (ΣΔ) modulator with a first positive reference and a first negative reference, the ΣΔ modulator configured to interface with a charge storage device, the ΣΔ modulator further configured to output a digital representation of a voltage potential of the charge storage device, the first positive reference electrically connected to a first terminal of the charge storage device and the first negative reference electrically connected to a second terminal of the charge storage device; and
    a second ΣΔ modulator, the second ΣΔ modulator with a second positive reference and a second negative reference, the second ΣΔ modulator configured to interface with a second charge storage device, the second negative reference electrically connected to the first positive reference, the second ΣΔ modulator further configured to output a digital representation of a voltage potential of the second charge storage device, the second positive reference electrically connected to a first terminal of the second charge storage device and the negative reference electrically connected to a second terminal of the second charge storage device.

2. The system of claim 1, further comprising a level shifter electrically connected to the ΣΔ modulator, the level shifter configured to translate the output of the ΣΔ modulator to a ground referenced signal.

3. The system of claim 1, further comprising a resistor divider across the charge storage device, the resistor divider configured to sample the voltage potential of the charge storage device for input into the ΣΔ modulator.

4. The system of claim 1, wherein the ΣΔ modulator comprises:

an amplifier input stage with an NMOS transistor and an integration capacitor configured to convert the voltage potential of the charge storage device to a current;
a switching stage with a current reference, the switching stage configured to switch between the current reference and the current output of the amplifier;
a comparator stage configured to compare the integrated output of the amplifier or the current reference with a voltage reference; and
a flip flop stage configured to clock an output based on an output of the comparator.

5. The system of claim 4, wherein the flip flop stage is clocked by a clock derived from the voltage potential of the charge storage device.

6. The system of claim 1, further comprising a processor configured to process an output of a level shifter to perform at least one of charge storage device capacity measurement, over-voltage detection, under-voltage detection, and open cell detection.

7. The system of claim 1, wherein the density of the digital output of the ΣΔ modulator is relative to the voltage potential of the charge storage device.

8. A method of monitoring a charge storage device, comprising:
    receiving an analog input voltage from a charge storage device; and
    converting the analog input voltage to a digital representation with an analog to digital converter (ADC), the ADC referenced to positive and negative outputs of the charge storage device, wherein the charge storage device is one of a plurality of charge storage devices electrically connected in series, and further comprising generating a reference current for the ADC, the reference current generated from a positive terminal of the most positive voltage potential of the plurality of charge storage devices.

9. The method of claim 8, further comprising level shifting the digital representation to a ground referenced signal.

10. The method of claim 9, further comprising processing an output of the level shifter to perform at least one of charge storage device capacity measurement, over-voltage detection, under-voltage detection, over-current detection, and open cell detection.

11. The method of claim 8, wherein the digital representation is an output of a D flip flop.

12. The method of claim 11, further comprising clocking the D flip flop with a signal referenced to the positive and negative terminals of the charge storage device.

13. A system, comprising:
    a first sigma-delta (ΣΔ) modulator with a first positive reference and a first negative reference, the first ΣΔ modulator configured to interface with a first charge storage device, the first ΣΔ modulator further configured to output a first digital representation of a first voltage potential of the first charge storage device, the first positive reference electrically connected to a first terminal of the first charge storage device and the first negative reference electrically connected to a second terminal of the first charge storage device;
    a second sigma-delta (ΣΔ) modulator with a second positive reference and a second negative reference, the second ΣΔ modulator configured to interface with a second charge storage device, the second ΣΔ modulator further configured to output a second digital representation of a second voltage potential of the second charge storage device, the second positive reference electrically connected to a first terminal of the second charge storage device and the second negative reference electrically connected to a second terminal of the second charge storage device, the second terminal of the second charge storage device electrically connected to the first terminal of the first charge storage device; and a first resistor divider across the first charge storage device, the first resistor divider configured to sample the voltage potential of the first charge storage device for input into the first $\Sigma\Delta$ modulator and a second resistor divider across the second charge storage device, the second resistor divider configured to sample the voltage potential of the second charge storage device for input into the second $\Sigma\Delta$ modulator, wherein the current through the first resistor divider also flows through the second resistor divider.

14. The system of claim 13, further comprising a first level shifter electrically connected to the first $\Sigma\Delta$ modulator, the first level shifter configured to translate the output of the first $\Sigma\Delta$ modulator to a first ground referenced signal and a second level shifter electrically connected to the second $\Sigma\Delta$ modulator, the second level shifter configured to translate the output of the second $\Sigma\Delta$ modulator to a second ground referenced signal.

15. The system of claim 13, wherein the bottom of the second resistor divider is electrically connected to the top of the first resistor divider.

16. The system of claim 13, further comprising a processor configured to process an output of at least one of the first level shifter and the second level shifter to perform at least one of charge storage device capacity measurement, over-voltage detection, under-voltage detection, over-current detection, and open cell detection.

17. The system of claim 13, further comprising a first D flip flop configured to clock an output of the first $\Sigma\Delta$ modulator clocked by a signal referenced to the positive and negative terminals of the first charge storage device, and a second D flip flop configured to clock an output of the second $\Sigma\Delta$ modulator by a signal referenced to the positive and negative terminals of the second charge storage device.

* * * * *